US007453693B2

(12) United States Patent
Tomino et al.

(10) Patent No.: US 7,453,693 B2
(45) Date of Patent: Nov. 18, 2008

(54) NETWORK DEVICE

(75) Inventors: Hiroyuki Tomino, Tokyo (JP); Noriyasu Katoh, Tokyo (JP)

(73) Assignee: Allied Telesis Kabushiki Kaisha, Tokyo (JP)

( * ) Notice: Subject to any disclaimer, the term of this patent is extended or adjusted under 35 U.S.C. 154(b) by 1461 days.

(21) Appl. No.: 10/325,726

(22) Filed: Dec. 20, 2002

(65) Prior Publication Data

US 2004/0145867 A1 Jul. 29, 2004

(51) Int. Cl.
G06F 1/16 (2006.01)
F16M 11/00 (2006.01)
F28F 7/00 (2006.01)

(52) U.S. Cl. ................. 361/687; 361/704; 165/185; 248/676; 248/678; 248/346.03

(58) Field of Classification Search ......... 361/687–688, 361/704, 715; 165/80.1, 185; 257/712; D14/242
See application file for complete search history.

(56) References Cited

U.S. PATENT DOCUMENTS

| 5,289,342 | A | * | 2/1994 | Spalding et al. | ............. 361/699 |
| D366,455 | S | * | 1/1996 | Cheng | ....................... D13/147 |
| 6,059,384 | A | * | 5/2000 | Ho | ........................... 312/223.2 |
| 6,185,094 | B1 | * | 2/2001 | Ruch et al. | ................... 361/686 |
| 6,229,507 | B1 | * | 5/2001 | Nakamura et al. | ............ 345/82 |
| 6,364,278 | B1 | * | 4/2002 | Lin et al. | ..................... 248/676 |
| D464,340 | S | * | 10/2002 | Schmidt | .................... D14/242 |
| 6,497,013 | B1 | * | 12/2002 | Goto et al. | ............. 248/346.01 |
| D473,549 | S | * | 4/2003 | Nishi | ....................... D14/242 |
| 7,256,996 | B2 | * | 8/2007 | Egbert et al. | ................. 361/695 |
| 2003/0230699 | A1 | * | 12/2003 | George | ........................ 248/676 |
| 2004/0164216 | A1 | * | 8/2004 | Chen | ...................... 248/346.01 |
| 2006/0081752 | A1 | * | 4/2006 | Ke | .......................... 248/346.01 |
| 2007/0145230 | A1 | * | 6/2007 | Van Den Bossche et al. | ..... 248/682 |
| 2007/0272821 | A1 | * | 11/2007 | Chung | ......................... 248/676 |

FOREIGN PATENT DOCUMENTS

| JP | 61-183543 | 11/1986 |
| JP | H04-116180 U | 3/1991 |
| JP | H05-17794 U | 8/1991 |
| JP | 6-45394 | 6/1994 |
| JP | 08-018247 | 1/1996 |
| JP | 08-088476 | 2/1996 |
| JP | 09-091061 | 4/1997 |
| JP | 10-145051 | 5/1998 |
| JP | 11-214872 A | 8/1999 |
| JP | 2000-207054 | 7/2000 |
| JP | 2000-252655 | 9/2000 |
| JP | 2001-068864 | 3/2001 |
| JP | 2001-092563 A | 4/2001 |
| JP | 2001-242270 A | 9/2001 |

* cited by examiner

Primary Examiner—Jayprakash N Gandhi
Assistant Examiner—Zachary M Pape
(74) Attorney, Agent, or Firm—Stroock & Stroock & Lavan LLP

(57) ABSTRACT

An attachment mechanism for attaching to a wall a network device for assisting a communication device in communicating on a network includes a heat radiation member, engaged with and supporting a housing of the network device, for radiating heat from the network device, and an attachment member, engaged with the heat radiation member, for attaching to the wall the heat radiation member engaged with the housing.

4 Claims, 8 Drawing Sheets

NETWORK DEVICE

BACKGROUND OF THE INVENTION

The present invention relates generally to attachment mechanisms for attaching a network device, such as a hub, a router, and a switch.

Along with recent spread of LANs and WANs, many network devices, such as personal computers ("PCs" hereinafter) and hubs, switches, and routers (hubs etc. are also called "agents") have been connected to a network and its subnets for information sharing and frequent communications.

Recent various communication modes have require network devices to have various functions including those of a LAN, WAN, etc., as well as high processing capability to handle more communication devices, such as PCs, and larger traffic. In addition, the network devices have been required to be small along with the miniaturization of recent communication devices. As installations of the network devices have also recently been diversified according to users' usage modes and installment environments, the network devices have been not limited to a horizontal type to be placed horizontally on a desk, table, rack, etc. (collectively "desk" hereinafter in this application).

As the network devices have become multifunctional and sophisticated, their load and thus the calorific value increase, requiring efficient heat radiation. A larger housing of the network device would improve the radiation efficiency but would not meet the demand for miniaturization. Thus, the conventional network devices have not met the demands of improved radiation efficiency and diversified installments.

BRIEF SUMMARY OF THE INVENTION

Accordingly, it is an exemplified object of the present invention to provide an attachment mechanism and a network device having the same, which realize an improved heat radiation and diversified installments.

In order to achieve the above and other objects, an attachment mechanism for attaching to a wall (which may be any desired surface) a network device for assisting a communication device in communicating on a network includes a heat radiation member, engaged with and supporting a housing of the network device, for radiating heat from the network device, and an attachment member, engaged with the heat radiation member, for attaching to the wall the heat radiation member engaged with the housing. Such an attachment mechanism diversifies attachments by enabling the network device to be placed on a desk and a wall, and contributes to miniaturization because the heat radiation member serves as a heat radiator. The above network device having such an attachment mechanism exhibits the similar operations.

The attachment member may include a magnet, and the wall may be made of a material that may be coupled magnetically to the magnet. Thereby, the network device may be easily installed at a desired position on the wall without damaging the wall. The housing may include, as an attachment part engageable with the heat radiation member, a first attachment part for attaching the housing with a first orientation to the wall, and a second attachment part for attaching the housing with a second orientation different from the first orientation to the wall. This may diversify installments while satisfying user's preferences and wiring requirements. One of the attachment parts of the housing and the heat radiation member may form a convex part and the other may form a concave part into which the convex part is releasably insertable. This may easily connect the attachment part and the heat radiation member to each other and detach them from each other. In particular, when either of the attachment part and the heat radiation member is provided in plural, the releasable structure may diversify the orientations (for example, horizontal and perpendicular arrangements).

A network device of another embodiment of the present invention for assisting a communication device in communicating on a network includes a housing including a first surface and a second surface opposite to the first surface, a heat radiation groove, formed on the first surface, for radiating heat from the network device, and a concave part formed on the second surface, and a support member, fixed onto the housing, for enabling the network device to be placed on a desk while the first and second surfaces are approximately perpendicular to the desk, wherein the support member includes first and second perpendicular parts for holding the first and second surfaces of the housing, wherein the first perpendicular part includes a convex part that is engaged with and guided along the heat radiation groove formed on the first surface, and wherein the second perpendicular part includes a flat spring that is engaged with the concave part formed on the second surface and compresses the housing through the second surface of the housing toward the convex part, the flat spring and concave part being arranged such that the flat spring may be inserted into the concave part when the convex part is engaged with the heat radiation member at a predetermined position. According to this network device, the heat radiation groove has a heat radiation function and a positioning function. The flat spring applies an elastic force to the housing so as to enhance the engagement between the heat radiation groove and convex part. As the flat spring is engaged with the concave part, the housing may be easily prevented from falling or disengaging from the support member.

The support member further includes a horizontal part for supporting a third surface that is horizontal to the desk and perpendicular to the first and second surfaces of the housing, and the horizontal part including a heat conductive member for radiating the heat from the network device. The support member may further include a perpendicular part including the convex part and a heat radiation hole that is connected and opposite to the heat radiation groove. The first perpendicular part may further include a heat radiation hole provided at a position different from that of the convex part and connected to the heat radiation groove. Thereby, the support member fixes the housing but does not hinder the heat radiation effect for the housing. The network device may further include a plurality of terminals that extend perpendicular to the desk and each connectible to the communication device, when the network device is placed on the desk. For such a so-called longitudinal type of network device, the above support member helps to maintain stability when the network device is placed on the desk. Here, the longitudinal type is generally a network device that is installed on a desk such that its height from the desk becomes the highest.

Other objects and further features of the present invention will become readily apparent from the following description of preferred embodiments with reference to accompanying drawings.

DETAILED DESCRIPTION OF THE PREFERRED EMBODIMENTS

Figure 1:
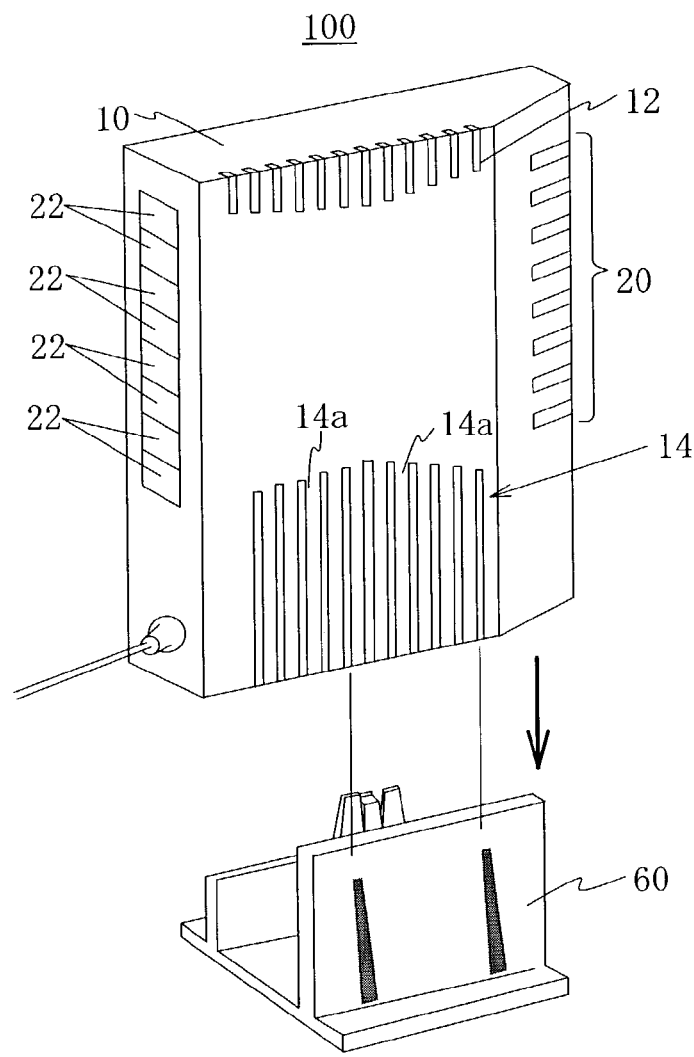
FIG. 1 is a perspective overview of a network device according to one embodiment of the present invention before its housing is coupled to a stand.
Figure 2:
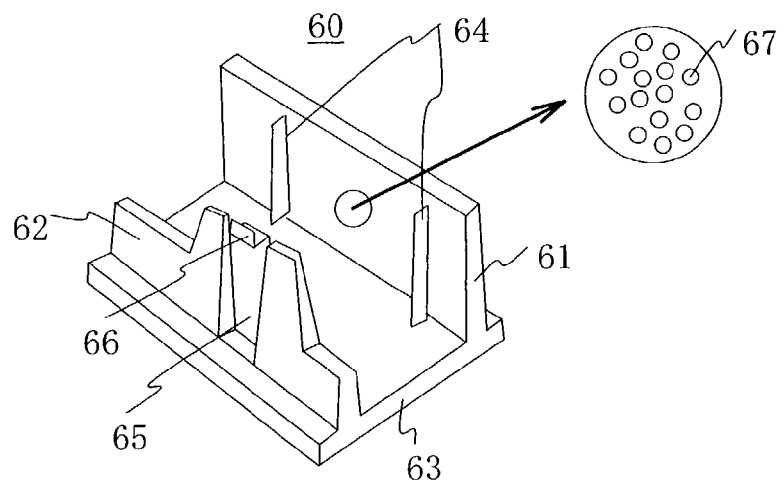
FIG. 2 is a perspective view of the stand shown in FIG. 1.
Figure 3:
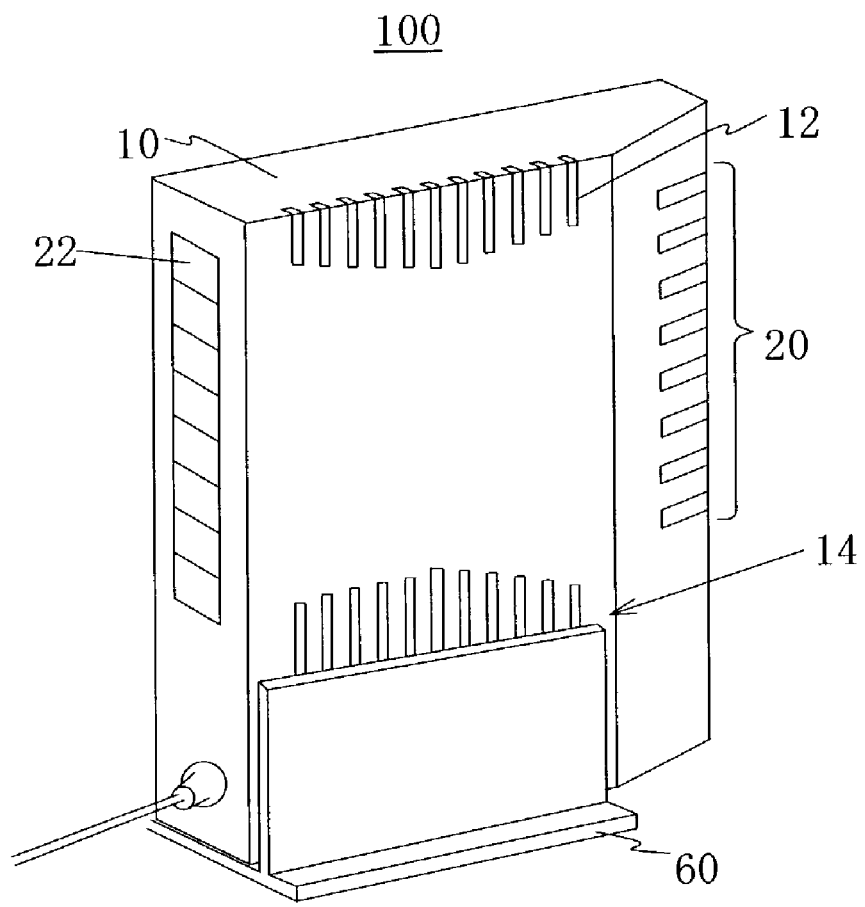
FIG. 3 is a perspective overview of the network device after its housing shown in FIG. 1 is coupled to the stand.
Figure 4:
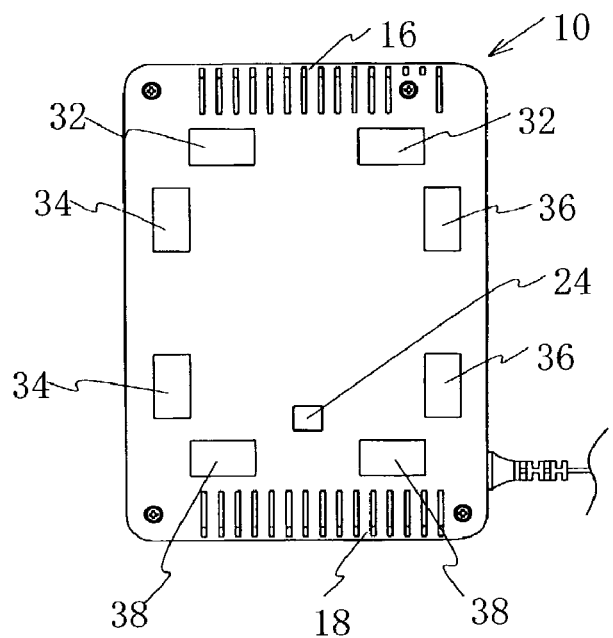
FIG. 4 is a rear view of the network device before its housing shown in FIG. 1 is coupled to the stand.

A description will now be given of a network device 100 according to one embodiment of the present invention. Here, FIG. 1 is a perspective overview of the network device 100 before a housing 100 is coupled to a stand 60. FIG. 2 is a perspective view of the stand 60. FIG. 3 is a perspective overview of the network device 100 after the housing 100 is coupled to the stand 60. FIG. 4 is a rear view of the network device 100 before the housing 10 is coupled to the stand 60.

The network device 100 of the instant embodiment is compatible with the Broad Band, and implemented as a switch that serves both as a LAN and a WAN. The network device 100 includes the housing 10, and the stand 60, releasably fixed onto the housing 10, for installing the housing 10 onto the desk (not shown).

The housing 10 has an approximately rectangular parallelepiped shape, and includes, as shown in FIGS. 1 and 4, a plurality of heat radiation grooves 12 to 18, an indicator 20, a communication port 22, a dent 24, and attachment parts 32 to 38.

The heat radiation grooves 12 to 18 exemplarily extend in the longitudinal direction and radiate the heat from the housing 10. The heat radiation groove 12 is provided at the top of the front surface of the housing 10, while the heat radiation groove 14 is provided at the bottom of the front surface of the housing 10. A plurality of grooves that form the heat radiation grooves 12 and 14 extend such that they may draw an arc at their ends. Thus, they have different lengths, but they may have the same length. The heat radiation groove 16 is provided at the top of the rear surface of the housing 10, while the heat radiation groove 14 is provided at the bottom of the rear surface of the housing 10. In the instant embodiment, two in a plurality of heat radiation grooves 14 serve as positioning and fixing grooves as a result of an engagement with the guide ribs 64 on the stand 60, as will be described later.

The indicator 20 includes a plurality of LEDs for visualizing communication statuses. For example, the indicator 20 detects and recognizes a link to Full Duplex or Half Duplex, a link to 100BASE-TX or 100BASE-T, a system error, a power supply error, etc.

The communication ports/terminals 22 exemplarily include longitudinally extending one WAN port and seven LAN ports. Thus, the network device 100 arranges the ports longitudinally and may be installed in a narrow space. An unshielded twisted pair ("UTP") cable is typically connected to each of the WAN port (or "MDI port") and LAN ports (or "MDI-X ports"). A WAN connecting device (such as an ADSL modem) is connected to the WAN port while a PC and hub are connected to the LAN port through the UTP cable.

The dent 24 is provided on the rear surface of the housing 10 and engageable with the projection 66 of the stand 60, which will be described later.

The housing 10 further includes four pairs of attachment parts 32 to 38 as shown in FIG. 4. The attachment parts 32 to 38 are used for another attachment method, which will be described later, and not used with the stand 60. The attachment parts 32 to 38 diversify installments of the network device 100 by enabling a user to select the stand 60 or the other attachment method, which will be described later. Each pair of attachment parts 32 to 38 has the same interval and size. The attachment parts 32 and 38 are arranged parallel, while the attachment parts 34 and 36 are arranged parallel to each other and perpendicular to the attachment parts 32 and 38. The present invention does not limit the number of attachment parts. The attachment parts 32 to 38 each include a projection 40 and an inlet 42, as described later.

Referring now to FIG. 2, the stand 60 includes a pair of opposing perpendicular parts 61 and 62 for holding the network device 100, and a horizontal part 63 for supporting the perpendicular parts 61 and 62.

The perpendicular part 61 includes a pair of guide ribs 64 that may be inserted into a pair of grooves 14a in the heat radiation grooves 14. If necessary, the guide ribs 64 are configured to be inserted into grooves at a left or right side of the grooves 14a. The guide ribs 64 are engaged with the grooves 14a, and position the network device 100. If necessary, a plurality of heat radiation holes 67 connected to the heat radiation grooves 14 are formed in the perpendicular part 61 as shown in FIG. 2 that partially enlarges the perpendicular part 61, thereby preventing the heat radiation efficiency from being lowered by the perpendicular part 61 closing off the heat radiation grooves 14. The heat radiation hole 67 may be formed in the perpendicular part 62 or horizontal part 63.

The perpendicular part 62 includes a flat spring 65 that includes a projection 66 at its tip. The flat spring 65 compresses the rear surface of the housing 10. The projection 66 is engaged with the dent 24, and fixes the housing 10.

The horizontal part 63 is placed on a desk (not shown) and supports the housing 10. If necessary, the horizontal part 63 is made of a heat conductive material, such as a SUS sheet metal. If necessary, the perpendicular parts 61 and 62 may be also made of heat conductive materials. As a result, the horizontal part 63 may transmit the heat from the network device 100 to the desk, radiating the heat from the network device 100.

Figure 5:
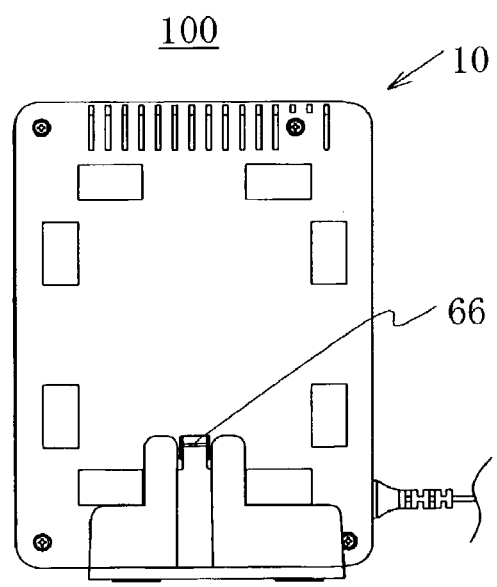
FIG. 5 is a rear view of the network device after its housing shown in FIG. 1 is coupled to the stand.

In attaching the housing 10 to the stand 60, as shown in FIG. 1, the grooves 14a and corresponding guide ribs 64 are aligned with each other and the housing 10 is inserted into the stand 60 as shown in FIG. 3. A proper alignment between the housing 10 and stand 60 would enable the guide ribs 64 to be engaged with the grooves 14a and projection 66 to be inserted into the dent 24, as shown in FIG. 5. Here, FIG. 5 is a rear view of the network device 100 after the housing 10 is coupled to the stand 60. As a result, the stand 60 positions and fixes the housing 10. As the network device 100 is diversified and sophisticated as in the instant embodiment, the increased load applied to a processor (not shown) in the network device 100 causes large calorific value and the heat radiation mechanism becomes important. On the other hand, it is preferable that the network device is made as small as possible in view of the demand for miniaturization of the network device. According to the network device 100 in the instant embodiment, the heat radiation grooves 14 serve to radiate the heat and position the stand 60, thus radiating the heat and protecting the inner electronic circuits from being thermally damaged without causing the housing to be large.

A description will now be given of another embodiment of the present invention. As described above, the instant embodiment uses, in addition to the housing 10, wall-hanging fitting 80 and screws 90 instead of the stand 60. The attachment parts 32 to 38 are used instead of heat radiation grooves 14 and dent 24 in the housing 10. In this embodiment, the housing 10 is fixed with a desired orientation onto a wall, partition, shelf, and other approximately perpendicular spots (referred to as a "wall" collectively in this application). Thus, the network 100 may be installed onto both a desk and wall, diversifying its installations.

Figure 6:
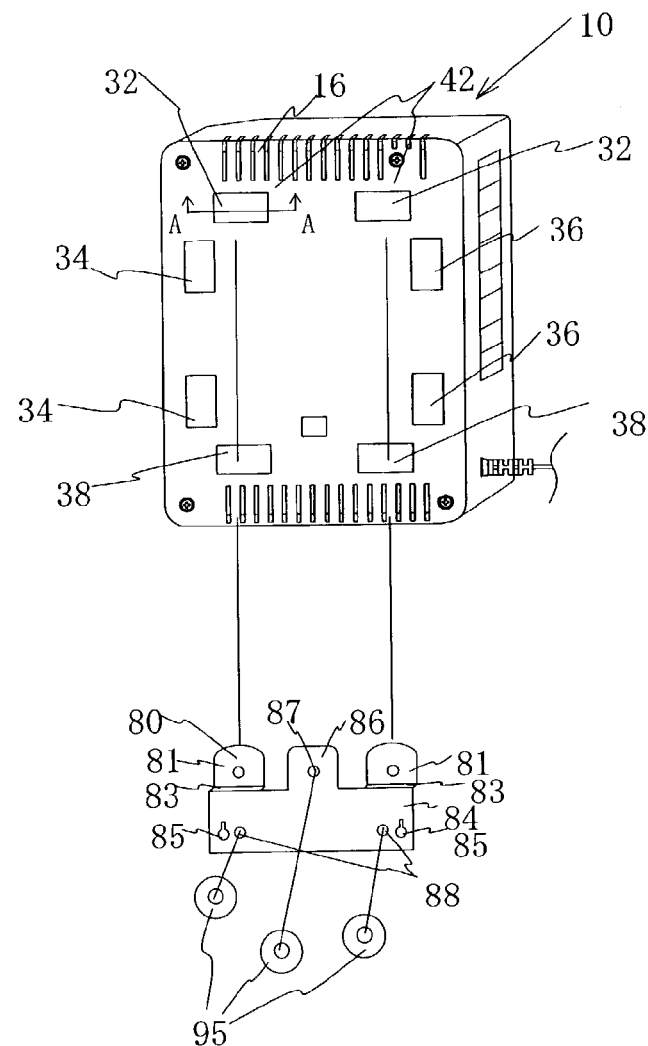
FIG. 6 is a perspective overview of the network device before a wall-hanging fitting is attached to the housing shown in FIG. 1.
Figure 7:
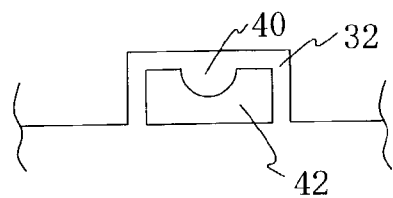
FIG. 7 is a sectional view taken along a line A-A in FIG. 6.
Figure 8:
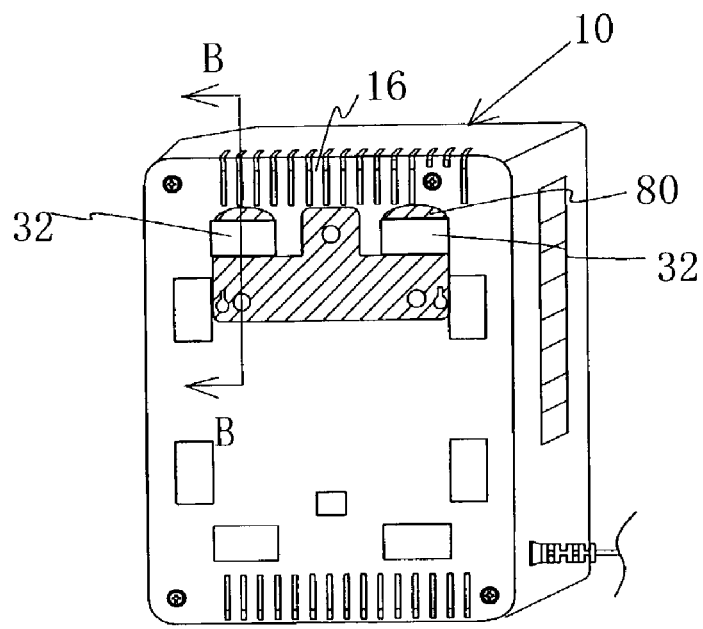
FIG. 8 is a perspective overview of the network device after a wall-hanging fitting is attached to the housing shown in FIG. 1.
Figure 9:
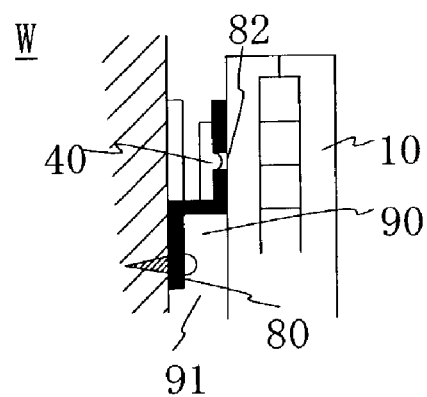
FIG. 9 is a sectional view taken along a line B-B in FIG. 8.

Referring now to FIGS. 6 to 8, a detailed description will be given of the attachment parts 32 to 38 in the housing 10. Here, FIG. 6 is a perspective overview of the housing 10 before the wall-hanging fitting 80 is attached to the housing 10. FIG. 7 is a sectional view taken along line A-A in FIG. 6. FIG. 8 is a perspective overview of the network device 100 after the wall-hanging fitting 80 is attached to the housing 10. FIG. 9 is a sectional view taken along line B-B in FIG. 8. W is a wall in FIG. 9.

As shown in FIG. 7, each attachment part has the projection 40 and inlet 42. The projection 40 is formed at an inner surface of each attachment part opposite to the housing 10 so that the projection 40 projects towards the housing 10. The projection 40 is inserted into the hole 82 in the wall-hanging fitting 80, which will be described later, and serves as a stopper for preventing the wall-hanging fitting 80 from falling off from the corresponding attachment part. Since the projection 40 may be separated from the hole 82, it enables the wall-hanging fitting 80 to be engaged with a desired pair of the attachment parts 32 to 38. An engagement part 81 of the wall-hanging fitting 80, which will be described later, is inserted into the inlet 42.

The wall-hanging fitting 80 is made, for example, of heat-conductive and rigid stainless, and has, as shown in FIG. 6, a pair of engagement parts 81, a pair of connection parts 83, a base 84, and an engagement part 86.

The engagement part 81 is connected to the base 84 through the connection part 83 at the back of the base 84. Each engagement part 81 exemplarily has a shape of a combination of a semi-circle and rectangle, and has the circular hole 82 at its approximate center thereof. The engagement part 81 is inserted into the inlet 42 of the corresponding attachment part, and the hole 82 engages with the projection 40 of the corresponding attachment part. Therefore, an interval between the engagement parts 81 is identical to that of the attachment part. Alternatively, the engagement part 81 may have a projection while the attachment part has a hole.

The connection part 83 is provided to maintain a space 91 for accommodating a head of the screw 90 when the wall-hanging fitting 80 is attached to the attachment part, as shown in FIG. 9. The connection part 83 also serves as a stopper for supporting the corresponding attachment part.

The base 84 has a pair of holes 85. As shown in FIG. 9, the screw 90 is inserted into the wall W through each hole 85. The base 84 further has a pair of screw holes used for a variation of this embodiment, which will be described later. A screw 98 is inserted into each screw hole 88 to fix the magnet 95, which will be described later.

The engagement part 86 is used in a variation of this embodiment, which will be described later, and connected to and level with the base 84. The same flat plane enables the rear surfaces of three magnets 95 (i.e., surfaces opposite to the fittings 80) to be flat when these three, same magnets 95 are used for the engagement parts 86. Therefore, even when a particular magnet is made thicker and the engagement part 86 is provided at the back of the base 84, the other surfaces of all the magnets 95 should form the same flat surface. The same flat surface is required to maintain horizontalness at the time of attachment of the housing 10 since the surface of the wall W is horizontal. The engagement part 86 has an exemplarily chamfered rectangular shape, and has a screw hole 87 at an approximate center thereof. The screw 98 is inserted into the screw hole 87, similar to the screw hole 88, for fixing the magnet 95, which will be described later.

In attaching the housing 10 to the wall W, the wall-hanging fitting 80 is fixed at a desired position on the wall W through two screws 90 and holes 85. Then, the engagement parts 81 are inserted into the inlets 42 in the desired attachment parts 32 to 38 so as to engage the projections 40 with the holes 82. FIGS. 8 and 9 select the attachment parts 32. As a result, the housing 10 may be attached to the wall W in a desired orientation.

A user may freely determine a position and orientation of the housing 10 relative to the wall W based on wiring requirements and his preferences. Even when the projection 40 is disengaged from the hole 82, the connection part 83 supports the housing 10. Since the head of the screw 90 is accommodated in the space 91, the screw 90 does not damage the rear surface of the housing 10. The fitting 80 is made of heat conductive material, and protects the electronic circuit in the housing 10 by transmitting heat from the housing 10 to the wall W through heat radiation grooves 16. Thus, the fitting 80 positions the housing 10 with the attachment parts 32 to 38 of the housing 10, determines an orientation of the housing 10, fixes the housing 10, and radiates the heat from the housing 10.

Figure 10:
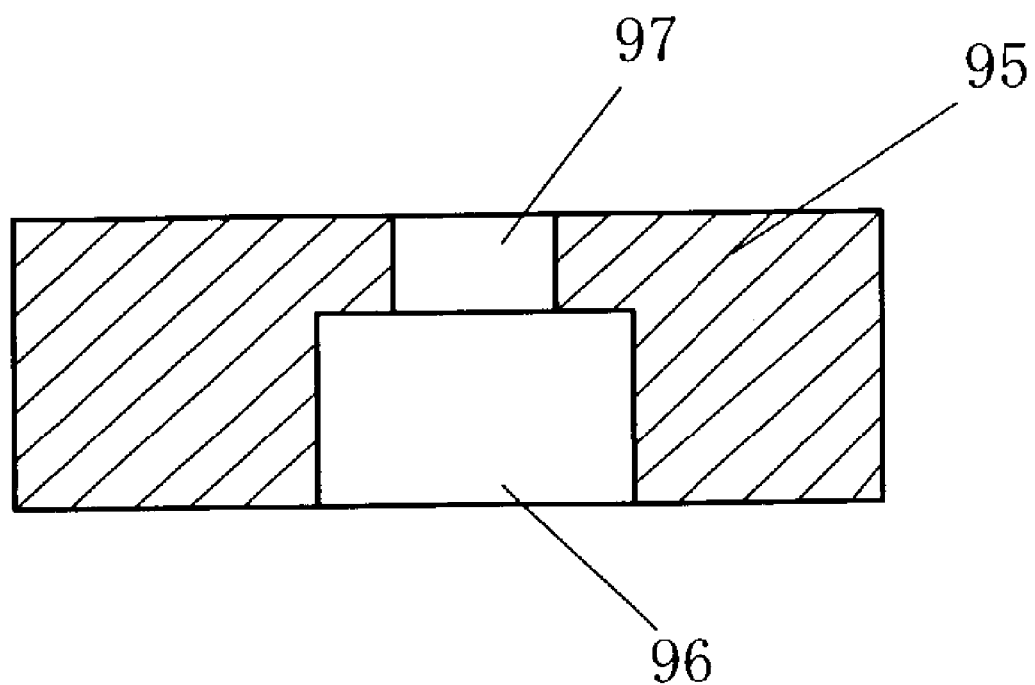
FIG. 10 is a sectional view of a magnet attachable to the wall-hanging fitting shown in FIG. 6.
Figure 11:
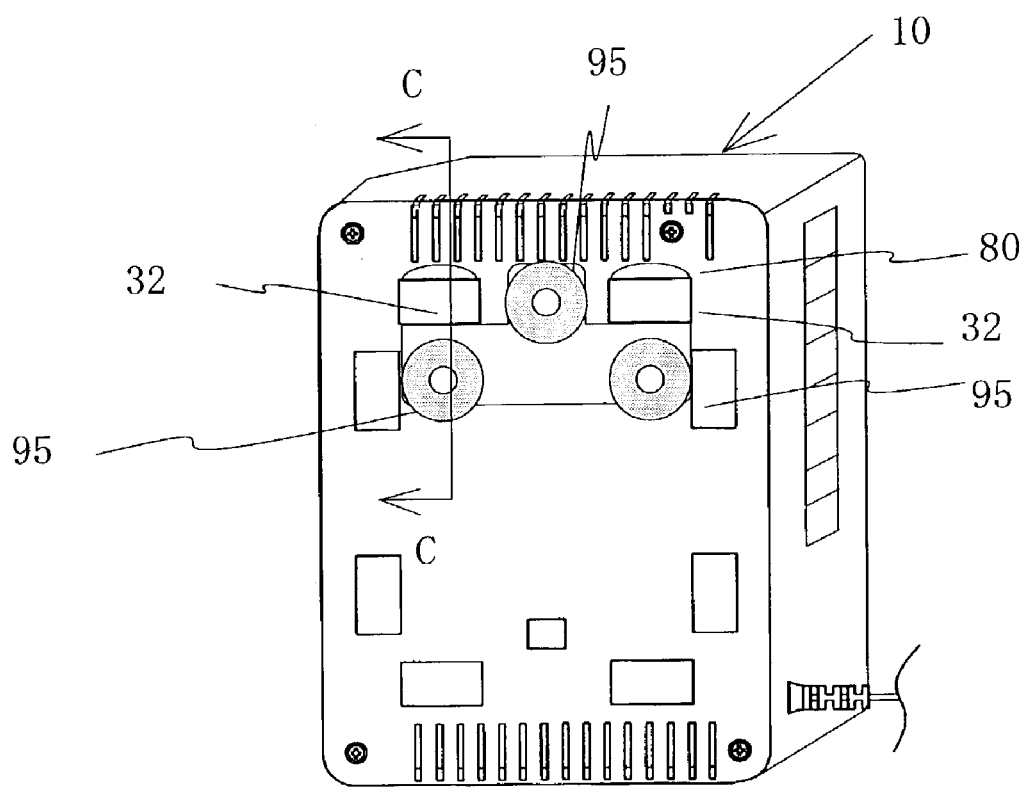
FIG. 11 is a perspective overview of the network device when the fitting and magnets are attached to the housing shown in FIG. 6.
Figure 12:
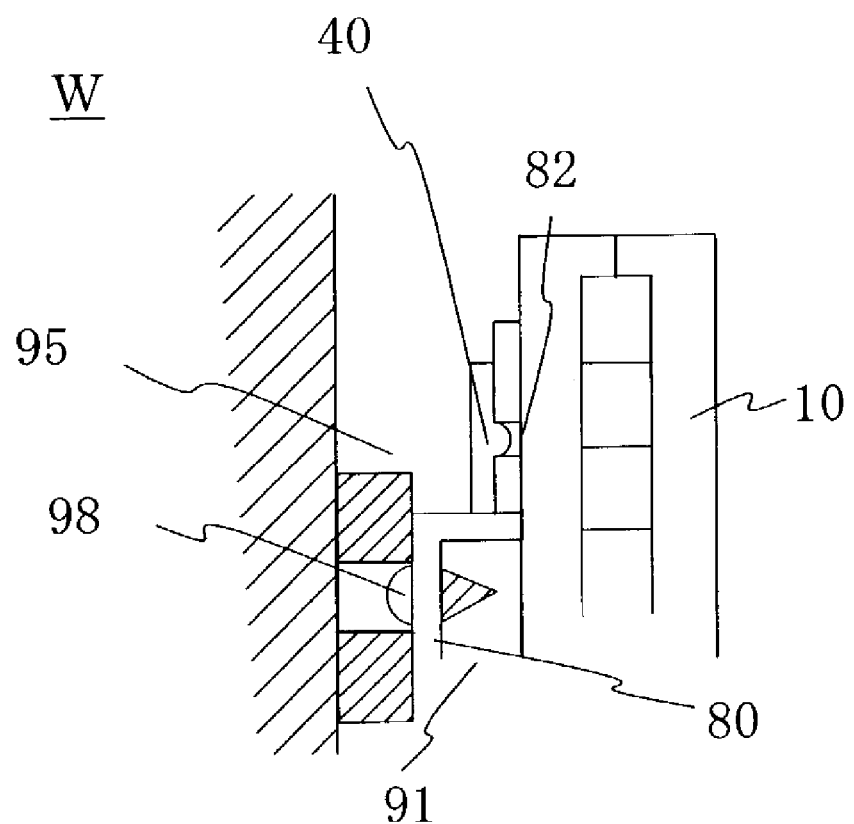
FIG. 12 is a sectional view taken along a line C-C in FIG. 12.

A description will now be given of a variation of the present embodiment with reference to FIGS. 6, 10 to 12. The instant embodiment also commonly uses the housing 10 and wall-hanging fitting 80, although it uses the magnets 95 instead of the screws 90. This embodiment also fixes the housing 10 onto the wall W with a desired orientation, although the wall W of this embodiment includes a metal material, such as steel, which may be magnetically coupled with a magnet. Here, FIG. 10 is a sectional view of magnet 95. FIG. 11 is a perspective overview of the network device 100 in which the wall-hanging fitting 80 and magnets 95 are attached to the housing 10. FIG. 12 is a sectional view taken along a line C-C in FIG. 11. FIG. 6 is a view before the magnets 95 are attached to the fitting 80.

The magnet 95 includes, as shown in FIG. 10, center holes 96 and 97 at its almost center. The center hole 96 accommodates, as shown in FIG. 12, the head of the screw 98 for fixing the magnet 95 onto the fitting 80. The center hole 97 has a diameter smaller than that of the center hole 96, which allows the body of the screw 98 to pass through but does not allow its head to pass through.

In attaching the housing 10 to the wall W, the magnet 95 is first fixed onto the screw holes 87 and 88 in the wall-hanging fitting 80. Then, the wall-hanging fitting 80 is secured in place using a magnetic force by the magnet 95. Surfaces which all the magnets 95 face the wall W form the same flat surface, maintaining the horizontalness of the housing 10 and enhancing the fixture.

Then, the engagement parts 81 are inserted into the inlets 42 of a desired pair of attachment parts 32 to 38 so that the projections 40 may engage with holes 82. FIGS. 11 and 12 select the attachment parts 32. As a result, the housing 10 may be attached to the wall W with a desired orientation. A user may freely determine the desired position on the wall W and the orientation of the housing 10 based on the wiring requirements and preferences. Even when the projection 40 is disengaged from the hole 84, the connection part 83 supports the housing 10. Since the screw part of the screw 98 is accommodated in the space 91, the screw 98 does not damage the rear surface of the housing 10. The wall-hanging fitting 80 is made of heat-conductive material and protects the electronic circuit in the housing 10 by transmitting heat from the heat radiation grooves 16 and other portions in the housing 10 to the wall W. Thus, the wall-hanging fitting 80 together with the attachment parts 32 to 38 of the housing 10 positions and fixes the housing 10, determines an orientation of the housing 10, and radiates the heat from the housing 10.

Further, the present invention is not limited to these preferred embodiments, and various modifications and variations may be made without departing from the scope of the invention. For example, the present invention does not limit the type of the network device 100 to a switch.

According to the attachment mechanism and network device of one aspect according to the present invention, since the attachment mechanism diversifies attachments and the attachment mechanism serves as a heat radiator, the network device may be made smaller than that separates the attachment function from the radiation function. According to the network device of another aspect according to the present invention, since the heat radiation groove serves as a combination of a heat radiation function and a positioning function, the network device may be made smaller than that separates the heat radiation function from the positioning function.

What is claimed is:

1. A network device for assisting a communication device in communicating on a network, the network device comprising:

a housing including a first surface and a second surface opposite to the first surface, a heat radiation groove, formed on the first surface, for radiating heat from the network device, and a concave part formed on the second surface; and a support member, fixed onto the housing, for enabling the network device to be placed on a desk while the first and second surfaces are approximately perpendicular to the desk, wherein the support member includes first and second perpendicular parts for holding the first and second surfaces of the housing, wherein the first perpendicular part includes a convex part that is engaged with and guided along the heat radiation groove formed on the first surface; and wherein the second perpendicular part includes a flat spring that is engaged with the concave part formed on the second surface and compresses the housing through the second surface of the housing toward the convex part, the flat spring and concave part being arranged such that the flat spring may be inserted into the concave part when the convex part is engaged with the heat radiation groove at a predetermined position.

2. A network device according to claim 1, wherein the support member further includes a horizontal part for supporting a third surface that is horizontal to the desk and perpendicular to the first and second surfaces of the housing, and the horizontal part including a heat conductive member for radiating the heat from the network device.

3. A network device according to claim 1, wherein the first perpendicular part further includes a heat radiation hole provided at a position different from that of the convex part and connected to the heat radiation groove.

4. A network device according to claim 1, further comprising a plurality of terminals that extend perpendicular to the desk and each connectible to the communication device, when the network device is placed on the desk.

* * * * *